US 7,681,158 B2

(12) United States Patent
Uchino et al.

(10) Patent No.: US 7,681,158 B2
(45) Date of Patent: Mar. 16, 2010

(54) DELAY BUDGET ALLOCATION WITH PATH TRIMMING

(75) Inventors: Taku Uchino, Kanagawa (JP); Alvan Ng, Austin, TX (US)

(73) Assignees: Kabushiki Kaisha Toshiba, Tokyo (JP); International Business Machines Corporation, Armonk, NY (US)

( * ) Notice: Subject to any disclaimer, the term of this patent is extended or adjusted under 35 U.S.C. 154(b) by 395 days.

(21) Appl. No.: 11/733,091

(22) Filed: Apr. 9, 2007

(65) Prior Publication Data
US 2008/0250371 A1  Oct. 9, 2008

(51) Int. Cl.
*G06F 17/50* (2006.01)

(52) U.S. Cl. .................. 716/6; 716/1; 716/12
(58) Field of Classification Search .............. 716/1, 716/6, 12
See application file for complete search history.

(56) References Cited

U.S. PATENT DOCUMENTS 7,353,477 B2 *  4/2008  Hathaway et al. .............. 716/6

OTHER PUBLICATIONS

Youssef et al., "Timing Constraints for Correct Performance", International Conference on Computer-Aided Design, 1990.

* cited by examiner

*Primary Examiner*—Thuan Do
(74) *Attorney, Agent, or Firm*—Law Offices of Mark L. Berrier

(57) ABSTRACT

Systems and methods for determining delay budget allocations for circuit elements. One embodiment comprises a method including defining timing edges and corresponding timing paths in an integrated circuit design, and determining delay budget allocations for each of the edges based on required arrival time and design slack (S,T) pairs associated with the different timing paths. The required arrival time is a maximum time when associated with forward paths, and a minimum time when associated with backward paths. (S,T) pairs associated with some timing paths are discarded (i.e., the corresponding timing paths are trimmed) to reduce the complexity of the delay budget allocation computations. Remaining (S,T) pairs are used to determine scaling factors for significant timing paths through the edges. The smallest of the scaling factors for each edge can be multiplied by an initial delay associated with the edge to produce a delay budget allocation associated with the edge.

16 Claims, 12 Drawing Sheets

```
Procedure CalcX:
[400] For each timing node v, Backward(v).
[401] For each timing node v, Forward(v).
[402] For each timing edge e,
[403]  begin
[404]    If  D(e)=D_min(e), then
[405]      begin
[406]        X(e)=1.
[407]      end
[408]    else
[409]      begin
[410]        X(e)=∞.
[411]        Let v_B denote the head of e.
[412]        Let v_F denote the tail of e.
[413]        For each (S_B,T_B) in B_set(v_B),
[414]          begin
[415]            For each (S_F,T_F) in F_set(v_F),
[416]              begin
[417]                x=(S_F −D_min(e)−S_B)/(T_B+D(e)−D_min(e)+T_F).
[418]                If x<X(e) then X(e)=x.
[419]              end
[420]          end
[421]      end
[422]  end
[423] return
```

Fig. 4

Procedure Backward($v$):
[500] If node $v$ is already visited, then return.
[501] If node $v$ is the starting node of a path, then $B_{set}(v)=\{(A(v),0)\}$ else $B_{set}(v)=\emptyset$, return.
[502] For each incoming edge $e$ to node $v$,
[503] begin
[504]   Let $u$ denote the head of edge $e$.
[505]   Backward($u$).
[506]   For each element $(S_B,T_B)$ in $B_{set}(u)$,
[507]   begin
[508]     $S_B \leftarrow S_B + D_{min}(e)$.
[509]     $T_B \leftarrow T_B + D(e) - D_{min}(e)$.
[510]     Add $(S_B,T_B)$ to $B_{set}(v)$.
[511]   end
[512] end
[513] For each $(S_B',T_B')$ in $B_{set}(v)$
[514] begin
[515]   For each $(S_B,T_B)$ in $B_{set}(v)$ excluding ones already picked up at line [513]
[516]   begin
[517]     If $S_B' \leq S_B$, $T_B' \leq T_B$ and $S_B' \times T_B \leq S_B \times T_B'$
[518]     begin
[519]       Remove $(S_B',T_B')$ from $B_{set}(v)$.
[520]       Go to line [526].
[521]     end
[522]     If $S_B \leq S_B'$, $T_B \leq T_B'$ and $S_B \times T_B' \leq S_B' \times T_B$
[523]     begin
[524]       Remove $(S_B,T_B)$ from $B_{set}(v)$.
[525]     end
[526]   end
[527] end
[528] return

Fig. 5

```
Procedure Forward(u):
[600] If node u is already visited, then return.
[601] If node u is the ending node of a path, then F_set(u)={(R(u),0)} else F_set(u)=∅, return.
[602] For each outgoing edge e from node u,
[603]   begin
[604]     Let v denote the tail of edge e.
[605]     Forward(v).
[606]     For each element (S_F,T_F) in F_set(v),
[607]       begin
[608]         S_F ← S_F −D_min(e).
[609]         T_F ← T_F +D(e)−D_min(e).
[610]         Add (S_F,T_F) to F_set(u).
[611]       end
[612]   end
[613] For each (S_F',T_F') in F_set(u)
[614]   begin
[615]     For each (S_F,T_F) in F_set(u) excluding ones already picked up at line [613]
[616]       begin
[617]         If S_F≤S_F', T_F≤T_F' and S_F×T_F'≤S_F'×T_F
[618]           begin
[619]             Remove (S_F',T_F') from F_set(u).
[620]             Go to line [626].
[621]           end
[622]         If S_F'≤S_F, T_F'≤T_F and S_F'×T_F≤S_F×T_F'
[623]           begin
[624]             Remove (S_F,T_F) from F_set(u).
[625]           end
[626]       end
[627]   end
[628] return
```

Fig. 6

DELAY BUDGET ALLOCATION WITH PATH TRIMMING

BACKGROUND

1. Field of the Invention

The invention relates generally to the design of integrated circuits and more particularly to systems and methods for providing delay budget assignments that meet circuit timing requirements.

2. Related Art

As digital devices (e.g., integrated circuits) have become more complex, including more and more electronic components, better tools are needed to design these devices. In particular, the efficiency of the tools is in need of improvement just to handle the ever increasing size of the design problems.

Part of the task of designing a digital device is to determine the timing for the device's circuits. The devices will only work properly if data and control signals are available when they are needed. For instance, circuitry that receives certain data at time t1 may have to process the data and generate a corresponding output signal by time t2 so that it can be used by another part of the device. A proposed design for the circuitry must therefore meet the timing constraint that the delay along a path through the circuitry is no more than t2-t1 (the delay budget.) The performance of the device may also be affected by the allocation of this delay budget to subcomponents of the circuitry along the path. Delay budget assignment is a very important part of integrated circuit design. It is performed to distribute the timing slack (extra time that is available) on a given timing path to the path components, such as interconnects, cells, nets, etc. This is done in such a way that all timing constraints (of which there are usually many) are satisfied.

Previously, this was accomplished using a methodology that required the computation of timing for every path through a given component and scaling the timing for the component according to the tightest timing constraint. Using this methodology, an initial delay was first assigned to each component in the circuit. Then, for each component, all the paths that included the component were determined. For each of these paths, it was necessary to determine the path delay (the sum of all the component delays in the path,) and the total budget (maximum delay) for the path. From these values, a scaling factor was determined. This scaling factor was equal to the smaller of: 1; or the budget divided by the current path delay. The component being considered therefore had multiple scaling factors (one for each delay path through the component) associated with it. The smallest of the scaling factors was chosen for the component, and the delay budget for the component was determined by taking the product of the selected scaling factor and the delay initially assigned to the component (or a minimum component delay, whichever was larger.)

As the complexity of the circuits grew, however, this methodology became increasingly expensive and impractical because of the required evaluation of each and every path through the circuit. The computational expense of this methodology led to the use of another methodology that replaced the exact computation of the smallest scaling factor with an approximation. Rather than computing the scaling factor for every path through the component, the scaling factor was approximated by dividing the smallest of the required path delays for all of the paths by the largest of the current path delays for all of the paths. Because the different paths through the component under consideration could have very different delays, this approximation could be very inaccurate. For instance, even if all of the paths already satisfied their timing constraints (i.e., the current path delay is less than or equal to the required path delay,) different overall delays in the paths would result in selection of a scaling factor less than 1 (implying that one or more of the paths violate the corresponding timing constraints.)

It would therefore be desirable to provide systems and methods for delay budget assignment that do not incur the computational expense of the first methodology, and do not suffer from the inaccuracies of the second methodology.

SUMMARY OF THE INVENTION

One or more of the problems outlined above may be solved by the various embodiments of the invention. Broadly speaking, the invention includes systems and methods for improved design of integrated circuits (IC's) and more particularly to the determination of delay budgets for the various parts of the circuits.

One embodiment comprises a method for determining delay budget allocations in an integrated circuit. This method includes defining timing edges and corresponding timing paths in an integrated circuit design, and determining delay budget allocations for each of the edges based on the arrival time and design slack (S,T) pairs associated with the different timing paths. S represents the minimum achievable arrival time when used with respect to backward paths, and the maximum allowable arrival time when used with respect to forward paths. T represents the design slack, which is the slack (extra time taken compared to the fastest implementation) in the delay associated with the backward or forward path being considered. (S,T) pairs associated with some of the timing paths are discarded (i.e., the corresponding timing paths are trimmed) to reduce the complexity of the delay budget allocation computations. For each of the edges, a set of (S,T) pairs characterizing timing paths beginning or ending at the edge are determined. Some of the (S,T) pairs are associated with forward paths beginning at the edge and some of the (S,T) pairs are associated with backward paths ending at the edge. (S,T) pairs associated with trimmed timing paths are not included in the set. Scaling factors are then determined for each combination of an (S,T) pair associated with a forward path and an (S,T) pair associated with a backward path. The smallest of the scaling factors can be multiplied by an initial delay associated with the edge to produce a delay budget allocation associated with the edge.

In one embodiment, the (S,T) pairs are determined for forward and backward timing paths from the edge being considered. (S,T) pairs and corresponding timing paths are trimmed during the examination of both forward and backward timing paths. The (S,T) pairs and corresponding timing paths are trimmed according to trimming criteria. For backward timing paths, a selected backward timing path is trimmed if: the minimum arrival time (S) and design slack (T) associated with the selected backward timing path are less than or equal to the minimum arrival time (S') and design slack (T') associated with a second backward timing path, respectively; and the product S×T' is less than or equal to the product S'×T. Conversely, for forward timing paths, a selected forward timing path is trimmed if: the maximum arrival time (S) and design slack (T) associated with the selected forward timing path are greater than or equal to the maximum arrival time (S') and design slack (T') associated with a second forward timing path, respectively; and the product S×T' is greater than or equal to the product S'×T.

In one embodiment, a set of (S,T) pairs associated with each node in an integrated circuit can be determined before the scaling factors for the edges in the circuit are determined. For the first node in each backward timing path, S is set equal to a defined arrival time at the first node, and T is set equal to 0. For following nodes in the backward timing path, S is set to equal the S of the preceding node plus a minimum delay of the intervening edge. T is set to equal the T of the preceding node, plus a current delay of the intervening edge, minus the minimum delay of the intervening edge. For the last node in each forward timing path, S is set equal to the required arrival time at the last node (which is a defined timing constraint,) and T is set equal to 0. For preceding nodes in the forward timing path, S is set equal to the S of the following node, minus a minimum delay of the intervening edge. T is set equal to the T of the following node, plus the current delay of the intervening edge, minus the minimum delay of the intervening edge.

An alternative embodiment comprises a software program product. This product is a computer-readable medium which contains program instructions that cause a computer to perform the method described above. The method may include retrieving and storing data characterizing the integrated circuit, and storing or presenting the resulting data (e.g., delay budget allocations) to a user. The computer-readable medium may be any storage medium suitable for storing the instructions, and may include removable media, such as CD's, floppy disks, flash drives, etc. The computer-readable medium may alternatively consist of a permanent storage medium or device, such as a memory chip within a computer, a disk drive, or the like. Other media may be suitable as well.

Numerous additional embodiments are also possible.

BRIEF DESCRIPTION OF THE DRAWINGS

Other objects and advantages of the invention may become apparent upon reading the following detailed description and upon reference to the accompanying drawings.

FIG. 4 is a block of pseudocode implementing a driver in accordance with one embodiment.

FIG. 5 is a block of pseudocode implementing a function for tracing backward timing path segments in accordance with one embodiment.

FIG. 6 is a block of pseudocode implementing a function for tracing forward timing path segments in accordance with one embodiment.

Figure 1A:
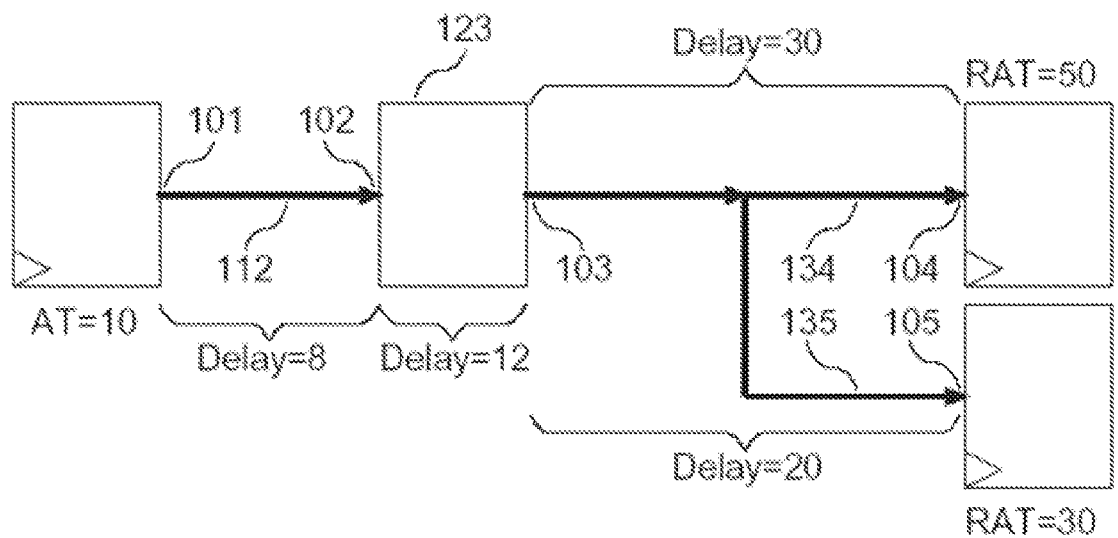
FIG. 1 is a functional block diagram illustrating a simple system in accordance with one embodiment.

While the invention is subject to various modifications and alternative forms, specific embodiments thereof are shown by way of example in the drawings and the accompanying detailed description. It should be understood that the drawings and detailed description are not intended to limit the invention to the particular embodiments which are described. This disclosure is instead intended to cover all modifications, equivalents and alternatives falling within the scope of the present invention as defined by the appended claims.

DETAILED DESCRIPTION OF EXEMPLARY EMBODIMENTS

One or more embodiments of the invention are described below. It should be noted that these and any other embodiments described below are exemplary and are intended to be illustrative of the invention rather than limiting.

As described herein, various embodiments of the invention comprise systems and methods associated with integrated circuits (IC's) to manage and/or design the timing of signals conveyed through the various parts throughout an IC. More particularly, the embodiments of the invention include systems and methods for reducing the computational power required to determine delay budget allocations to edges (circuit components and interconnects) along timing paths in an IC.

In one embodiment, a circuit design includes a number of timing paths. Each timing path traverses various interconnects and circuit components, and has associated timing constraints, such as minimum or maximum arrival times at end and/or intermediate nodes in the path. In the initial design, delays are assigned to each of the interconnects and circuit components or other cells (all of which may also be referred to as edges in a node-edge representation of the circuit.) These delays, however, may not meet the timing constraints, so it is necessary to perform delay budget allocation in order to determine how much of the total timing path delay can be allocated to each edge.

In determining the delay budget allocation for a particular edge, rather than computing a scaling factor for each and every timing path that traverses the edge, paths which can be determined not to affect the allocation are trimmed. The determination of whether a path will affect the allocation is based on whether the path would result in a larger or smaller scaling factor than other paths. If it can be determined that a path would result in a larger scaling factor than other paths through the edge, the path can be trimmed (since it is desired to find the smallest scaling factor.

The present method involves selecting an edge to consider, then decomposing each path that traverses the edge into a backward path, the edge itself, and a forward path. The set of backward paths that precede the edge can be examined to determine which ones (or which corresponding characteristics) can be trimmed, or disregarded. Similarly, the set of forward paths that follow the edge can be examined to determine which ones can be trimmed. Then, the possible combinations of the untrimmed backward and forward paths are examined to determine which combination results in the smallest scaling factor. This scaling factor is then used to determine the delay budget allocation for the edge. More specifically, the delay budget allocation is determined by taking the product of the identified scaling factor and the initial delay associated with the edge and taking this product as the delay budget allocation for the edge (unless the product is less than a minimum possible delay, in which case the minimum delay is used as the delay budget.)

The embodiments of the invention may provide a number of advantages over conventional systems. Primarily, it is contemplated that the present systems and methods will require substantially less computational resources than conventional methods to determine an accurate solution, rather than simply an approximation, for the desired minimum scaling factor.

Various embodiments of the invention will be described below. The description will focus primarily on one exemplary method using path trimming to determine minimum scaling factors and resulting delay budget allocations. A scaling factor x is used to scale edge e's timing delay to meet the timing requirement of an encompassing path p. X(e) is the smallest delay scaling factor an edge considering all encompassing paths and is sought for each edge. This method derives benefit from the recognition that not all the paths through a timing edge carry significance in the determination of the edge's delay budget allocation. By eliminating paths which are not significant, the number of calculations can be drastically reduced.

It should be noted that several terms used in the following discussion, such as delay, delay budget, etc. involve time. While values for these items are provided in some of the examples below, the units of measurement for the values are not specified, since they are not relevant to the discussion. It should also be noted that collections of circuit elements connecting two endpoints are referred to as paths. The circuit elements may include interconnects, components, collections of interconnects and components, etc. Collections of interconnects may be referred to as nets. Elements or nets may also be referred to as cells. A circuit may be divided into elements which may be connected to each other at pins. The elements may be represented by or referred to as edges, and the pins or connections between the elements may be represented by or referred to as nodes.

Figure 1B:
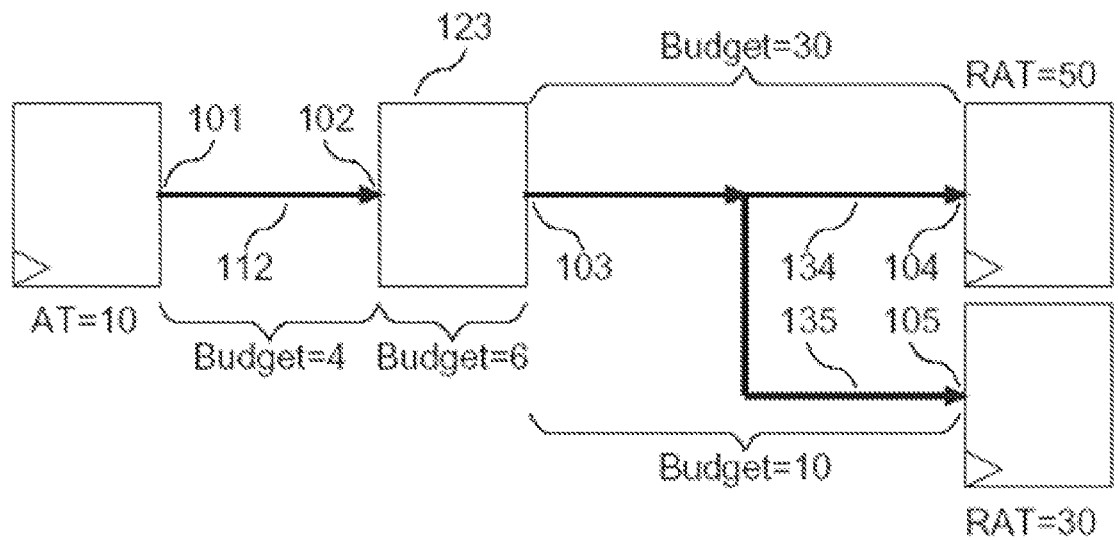

Before describing exemplary embodiments of the invention, it will be helpful to describe the previous methodologies in greater detail. FIGS. 1A and 1B are diagrams illustrating an example of delay budget assignment. FIG. 1A illustrates a circuit design with an initial set of delays associated with each of the interconnects and components. FIG. 1b illustrates the circuit with delays for the interconnects and components altered to meet timing constraints.

Every path has a starting point and an ending point. The path may comprise various elements. The paths may denoted, for example, by the nodes or elements traversed by the path. The total time to traverse the path is calculated by summing the delays encountered along that path. When a constraint specifies a required arrival time at the end, and the time to traverse the path is less than that required, there is (positive) "slack" in the timing. When the slack is negative, the timing constraint has been violated.

In FIG. 1a, an arrival time (AT) of 10 is specified for starting pin 101 and required arrival times (RAT) of 50 and 30 are specified for ending pins 104 and 105, respectively. The current path arrival times (calculated by summing the starting arrival time and subsequent path delays) are 60 and 50, respectively. Hence, the timing slacks for the paths are −10 and −20, respectively. Both calculations of slack are negative so the timing constraints (e.g., required arrival time) were not met by the specified delays.

In such a case, to meet the timing constraints, the delays must be adjusted. A delay budget needs to be determined/specified, within which the timing constraints will be met. For example, the delays may be adjusted as shown in FIG. 1b. In FIG. 1b, the delay budgets for the various subpaths are 4, 6, 30 and 10. Note that the timing slack for both paths is now 0. The delay budget for component 123 is now 6, a reduction from the initial 12. Component 123 needs to be redesigned or replaced with a comparable component that fits within the required delay budget. For example, to realize the new delay budget for a particular component, a device with an appropriate internal delay could be chosen from a component library. The replacement component could employ an alternative structure, different wire widths, or other design factors to provide a different delay than the originally selected component.

In the above example, it is not shown how to determine a delay budget for the given circuit. One of the most well-known approaches used to assign delay budget was described by H. Youssef, and E. Shragowitz, in "Timing Constraints for Correct Performance", International Conference on Computer-Aided Design, 1990. This paper is referred to as [YS90] in the following.

The paper [YS90] describes a path-based delay scaling. It will be illustrated using the data from FIG. 1a and diagrammed later in graph form in FIG. 7. In FIG. 1a, the arrival time (AT) at pin 101 is 10, and the path delay for a first path from pin 101 to pin 104 is the sum 8+12+30=50. The arrival time at pin 104 is then 10+50=60 which is 10 more than the required arrival time (RAT) at pin 104 of 50. That is, the timing slack for the path from pin 101 to 104 is −10. To match (or beat) the required arrival time the path delay must be reduced by 10. That is, to make the timing slack non-negative for the path, the path delay must be equal to or less than that required. In this case the path delay needs to be less than or equal to 50−10=40. The ratio of the required path delay to the current path delay is 40/50=0.8. This ratio is called the "delay scaling factor". If each delay along the path is scaled by the delay scaling factor, the timing slack will be 0 (zero). The result of such scaling of path delays 8,12 and 30 by 0.8 would be 6.4, 9.6 and 24, respectively. The new timing slack of the first path from pin 101 to pin 104 is then 50−(10+6.4+9.6+24)=0. A second path is now considered.

A second path from pin 101 to pin 105 must be also considered. The delay scaling factor of the second path is 20/40=0.5 since the current path delay is 8+12+20=40 and the required path delay (to make timing slack 0) is 30−10=20. Using a delay scaling factor of 0.5 for the second path, the path delays 8, 12 and 20 become 4, 6 and 10, respectively.

Note that different delay budgets may be calculated for some parts of a path (a.k.a., subpaths, nets, edges). For example, there is an intersection (from pin 101 to pin 102) of the first and second paths. The delay for the intersection was 6.4 using the delay scaling factor of the first path ending at pin 104. On the other hand, it was 4 using the delay scaling factor of the second path ending at pin 105. To satisfy the timing constraints for both paths, the smallest delay must be chosen. Hence, the delay budget from pin 101 to pin 102 is min(6.4, 4)=4. In FIG. 1b, the delay budget from pin 101 to pin 102 was calculated in this way. Similarly, the delay budget from pin 102 to pin 103 (component 123) is min(9.6,6)=6, and so on. Generalizing the above discussion, the delay budget for a timing edge e is expressed as follows:

$$B(e) = D(e) \times X(e), \quad \text{Equation 1}$$

$$X(e) = \min_{p \in P(e)} \frac{S(p)}{T(p)}, \quad \text{Equation 2}$$

where B(e) is the delay budget for timing edge e, D(e) is the current delay of timing edge e, P(e) is the set of the paths going through timing edge e, S(p) is the required path delay of path p, and T(p) is the current path delay of path p. Equation 1 and Equation 2 are special cases of the equations to be described below.

Figure 2:
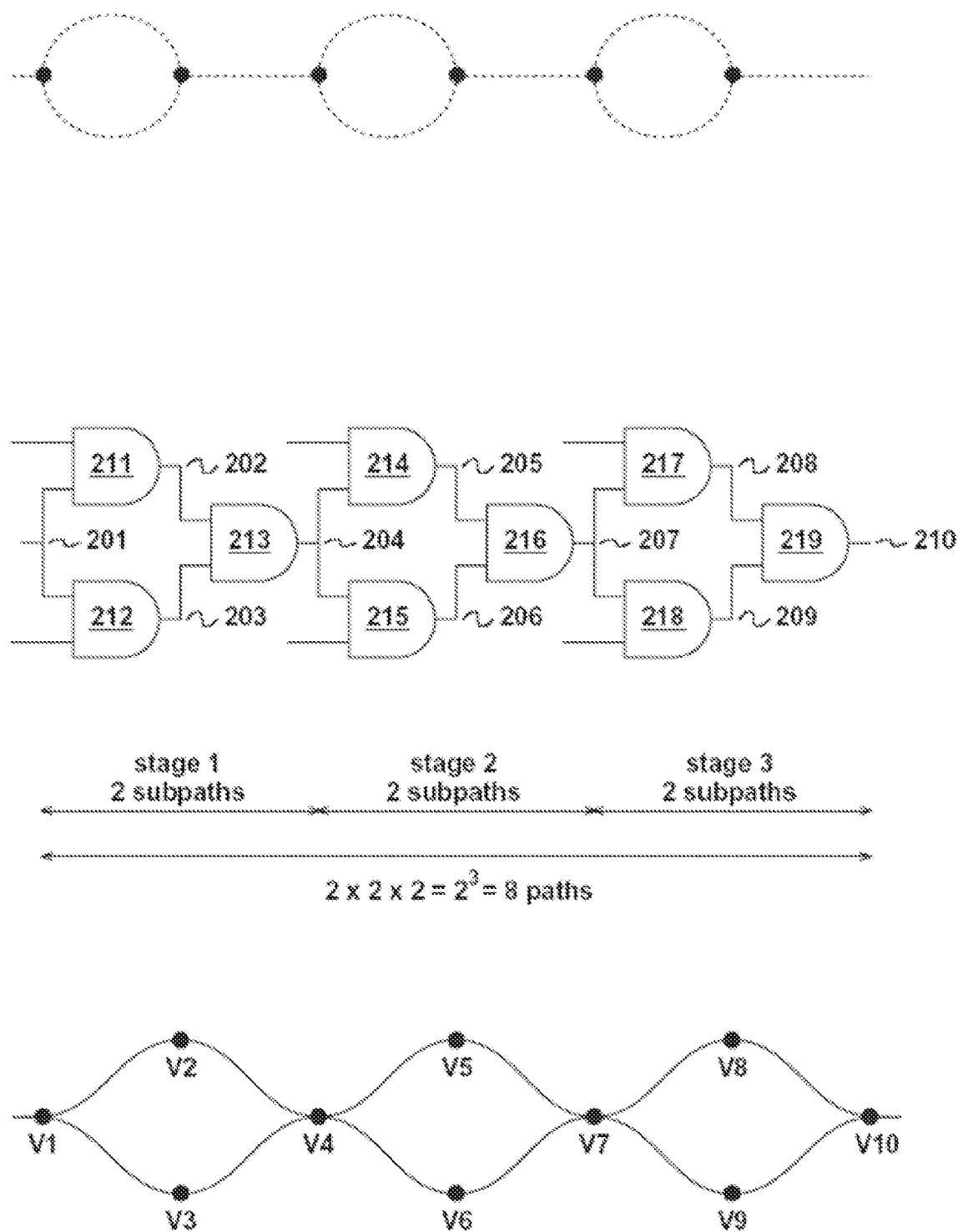
FIG. 2 is a functional block diagram illustrating growth in the number of timing paths with increasing circuit complexity.

As shown in the above example, the basic idea of [YS90] is very simple. However, in practice, it is difficult to use since all paths through each timing edge must be considered to determine delay budget for that timing edge, all timing edges must be considered and the number of the paths going through a timing edge can be huge. FIG. 2 illustrates the case where the number of paths is an exponential function of the number of the logic stages. Pin 201 corresponds to node V1, pin 202 corresponds to node V2, and so forth. The edge through component 211 connects V1 (201) to V2 (202). From pin 201 to 210 there are stages 1, 2, and 3, and each stage has two subpaths. For example, Stage 1 has subpath (V1,V2,V4) and subpath (V1,V3,V4). Each of these is connected to the two subpaths of Stage 2 and each of these is connected to the two subpaths of Stage 3. There are 2×2×2=8 possible combinations of which path (V1,V2,V4,V5,V7,V8,V10) is one.

To overcome this difficulty, [YS90] proposed the following approximation of Equation 2 using the least required path delay and the greatest current path delay for the edge.

$$X'(e) = \frac{\min_{p \in P(e)} S(p)}{\max_{p \in P(e)} T(p)}$$  Equation 3

Note that the approximation X'(e) defined by Equation 3 is always less than or equal to X(e) as defined by Equation 2. Hence, the timing constraints are also satisfied with X'(e) defined by Equation 3. The time complexity to calculate X'(e) defined by Equation 3 is proportional to the number of the nets/edges, but not the number of the paths. Hence, calculating X'(e) defined by Equation 3 is faster than calculating X(e) defined by Equation 2. However, the approximation given by Equation 3 is sometimes far from the value given by Equation 2. For example, in FIG. 1, X(e) defined by Equation 2 gives X(e)=0.5 for timing edge from pin 101 to pin 102 while X'(e) defined by Equation 3 gives the pessimistic result X'(e)=20/50=0.4.

Additional details regarding the previous work [YS90] and some notation will now be described.

Let G=(V,E) denote a directed acyclic graph, where V represents the set of the timing nodes (vertices) and E represents the set of the timing edges. A timing edge e is denoted by an ordered pair of two timing nodes as e=(u,v), where u is the "head" (starting node) of edge e, and v is the "tail" (ending node) of edge e, respectively. A timing path p is specified by a series of timing nodes such as $p=(v_0, v_1, \ldots, v_n)$, where $v_0, v_1, \ldots, v_n$ are timing nodes. Node $v_0$ is the starting node of the path p, $v_n$ is the ending node of path p, and the other nodes such as $v_1, v_2, \ldots, v_{n-1}$ are intermediate nodes of path p. A path may also be specified with the corresponding series of timing edges such as $p=(e_0, e_1, \ldots, e_n)$, where p is the path and $e_0, e_1, \ldots, e_n$ are timing edges.

Timing parameters such as arrival time and required arrival time are assigned to nodes, and delay times are assigned to timing edges. Let A(v) denote the arrival time at node v, R(v) denote the required arrival time at node v, and D(e) denote the delay time of edge e. In addition to these timing parameters, the minimum delay of edge e is introduced, and is denoted by $D_{min}(e)$. The minimum delay is the least possible delay. For example, if the timing edge e represents a cell internal path from an input pin to an output pin, $D_{min}(e)$ represents the minimum cell internal delay among all the logically equivalent devices in a component library. If the timing edge e represents an interconnect, $D_{min}(e)$ represents the minimum interconnect delay among all the possible interconnect realizations obtained by adjusting interconnect parameters such as wire width, wire spacing, and routing layers. The difference between D(e) and $D_{min}(e)$, that is $D(e)-D_{min}(e)$, represents the "design slack" which is the freedom to adjust delay to meet timing requirements. To accommodate adjustments to the timing edge delay a "parameterized delay" D(e,x) is introduced. It is defined as follows:

$$D(e,x) = D_{min}(e) + x \times (D(e) - D_{min}(e)),$$  Equation 4 where x is the adjustable parameter and represents the delay scaling factor to be determined in the following. By assuming x is non-negative, it is guaranteed that D(e, x) can not be less than $D_{min}(e)$. Note also that D(e,x) is equal to D(e) when x=1. As will be shown, D(e,x) becomes delay budget B(e) when x is equal to X(e).

Similarly, a "parameterized path delay" $D_{path}(p,x)$ is introduced as follows:

$$D_{path}(p, x) = \sum_{e \in E(p)} D(e, x),$$  Equation 5 where $p=(v_0, v_1, \ldots, v_n)$ is a timing path, and E(p) is the set of timing edges on timing path p. Note that $E(p)=\{e_1, e_2, \ldots, e_n\}$, where $e_1=(v_0,v_1)$, $e_2=(v_1,v_2)$, ..., and so on. $D_{path}(p,x)$ is the summation of the "parameterized delay" of the timing edges on the path p. Note that the arrival time at timing node $v_n$ is $A(v_0)+D_{path}(p,x)$. This arrival time must be equal to or less than the required arrival time at timing node $v_n$. Hence, the timing constraint for path p is as follows:

$$D_{path}(p,x) \leq R(v_n) - A(v_0).$$  Equation 6

Equation 6 provides a constraint for parameter x. Using Equation 4, Equation 5, and Equation 6, the constraint for parameter x can be explicitly shown as follows:

$$x \leq \frac{S(p)}{T(p)},$$  Equation 7

$$S(p) = R(v_n) - A(v_0) - \sum_{e \in E(p)} D_{min}(e),$$  Equation 8

$$T(p) = \sum_{e \in E(p)} (D(e) - D_{min}(e)),$$  Equation 9 where S(p) is the maximum allowable additional propagation delay of the path, and T(p) is the "design slack" of the currently implemented element corresponding to the edge. Hence, Equation 7 means x represents the degree of improvement that the current implementation must achieve in order to meet the timing target of the path (i.e., to be less than or equal to the maximum allowable additional propagation delay of the path). (Note that S(p) and T(p) introduced in Equation 2 are the special cases where all the $D_{min}(e)$ were assumed to be 0 for simplicity.) To summarize the discussion so far, the timing constraint for path p is satisfied if the delay of each timing edge e on path p is equal to or less than D(e,x) with x satisfying Equation 7.

The functions will now be expressed as functions of edges, rather than paths. Let P(e) denote the set of the paths going through timing edge e. For each timing path p in P(e), the constraint for parameter x is given by Equation 7. To satisfy timing constraints to all the timing paths in P(e), the smallest x must be chosen. Let X(e) denote the smallest x for timing edge e. Using Equation 7, X(e) is expressed as follows:

$$X(e) = \min_{p \in P(e)} \frac{S(p)}{T(p)}. \qquad \text{Equation 10}$$

The delay budget of edge e, which is denoted by B(e), is defined as follows:

$$B(e)=D(e, X(e)). \qquad \text{Equation 11}$$

Note that all the paths must be examined to calculate X(e) defined by Equation 10. This is a problem since the number of paths can be an exponential function of the number of the logic stages. To avoid this time complexity problem, [YS90] proposed the following approximation of X(e) instead of the solution defined by Equation 10:

$$X'(e) = \frac{\min\limits_{p \in P(e)} S(p)}{\max\limits_{p \in P(e)} T(p)}. \qquad \text{Equation 12}$$

Note that X'(e) defined by Equation 12 is always equal to or less than X(e) defined by Equation 10. This means the timing constraints are also satisfied with X'(e) defined by Equation 12. The time complexity of the algorithm to calculate X'(e) defined by Equation 12 is proportional to the number of the nets/edges. This is because the same algorithms can be applied to calculate timing slack and arrival time to the calculation of S(p) and T(p), and it is well-known that these algorithms have linear time complexity with respect to the number of the nets/edges. The problem with Equation 12 is that it often gives pessimistic results as previously discussed. It is desirable to provide a computationally efficient determination of timing values which does not resort to (overly conservative) approximations.

To alleviate this approximation problem per [YS90], and the computational burden of the methods enumerating all paths, a more efficient method is needed (to determine the X(e) defined by Equation 2). A method is based on the fact that not all paths are needed to calculate the solution will be described.

The paths which do not contribute to the final solution need not be considered. A method which trims these, that is, eliminates these from the associated calculations, will prove to be more efficient if the "savings" is greater than any added overhead. Such a method is described below and, in practice, this method is faster than the algorithm without path trimming, even with the addition of overhead for the path trimming. The various embodiments of the invention may provide a number of other advantages apparent to those of skill in the art of the invention.

Instead of calculating approximated X'(e) defined by Equation 12, a more efficient method to calculate X(e) defined by Equation 10 can be used. To overcome the time complexity problem previously noted, a path trimming approach is used. To calculate required S(p) and current T(p) path delays, forward and backward (sub)paths are traced from each timing edge. During the path tracing, a part of S(p) and T(p) are calculated for a corresponding subpath. The conditions of Equation 22 and Equation 25 are examined to determine whether the partially calculated S(p) and T(p) are necessary or not. When it is determined that they are not necessary, they are removed, reducing run time.

Figure 3:
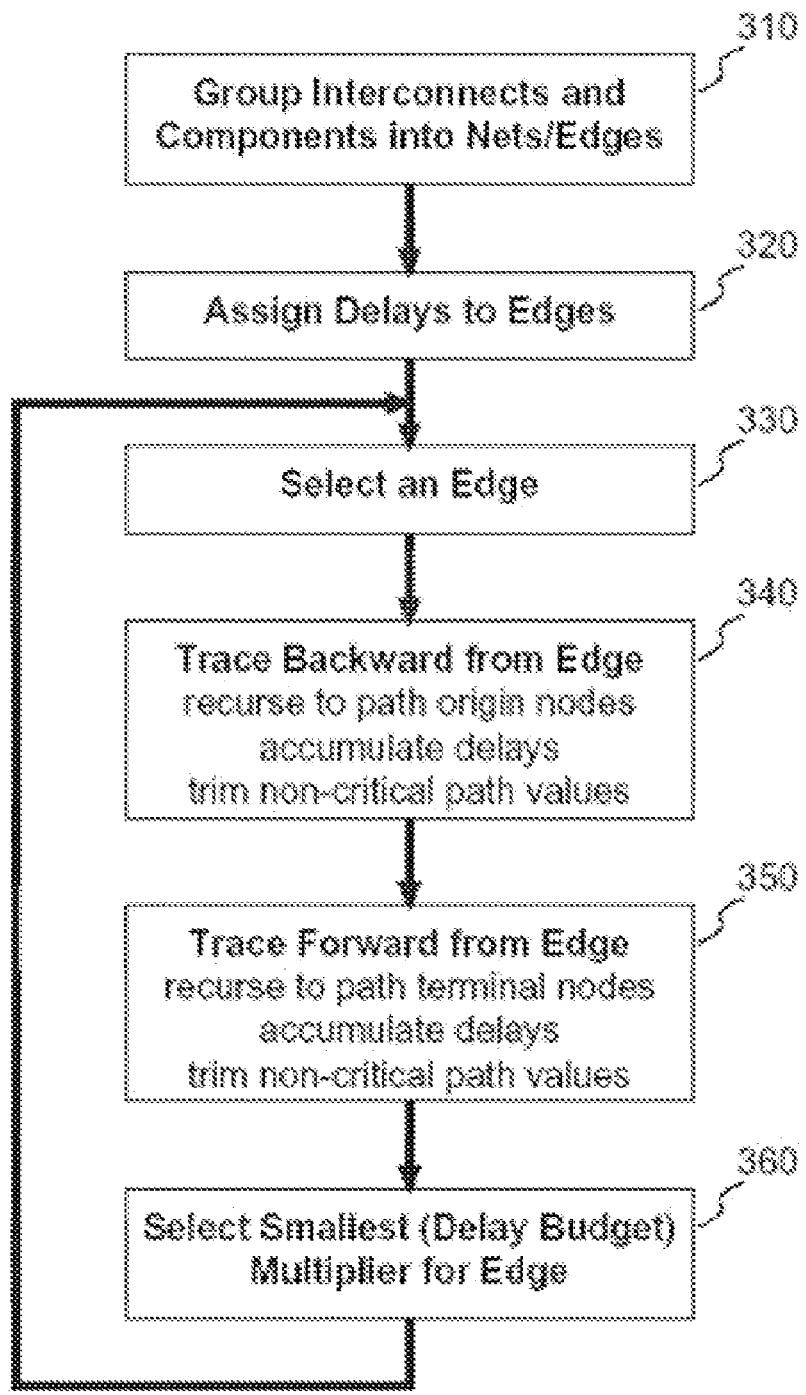
FIG. 3 is a flowchart illustrating a delay multiplier determination method incorporating path trimming in accordance with one embodiment.

FIG. 3 is a flowchart illustrating a method in accordance with one embodiment. An edge representation of an integrated circuit is created (310) and a timing delay is assigned to each according to an initial design (320). The edges are then processed to determine timing delay budgets satisfying any design timing requirements (330 through 360). Then, for each edge, the subpaths backward (340) and forward (350) of the current edge (which comprise the paths including the current edge,) are traced to determine the delay associated with a timing critical path.

The edges (nodes) comprising the subpaths preceding (backward of) the current edge are processed by a head recursive function (340). They are traced and the delays associated with the subpath edges are accumulated from the paths' originating nodes and trimmed. The trimming removes information associated with non-critical paths, thus reducing the amount of computation. Likewise, the nodes/edges comprising the subpaths following (forward of) the current edge are processed by a head recursive function (350). They are traced, and the delays associated with the subpath edges are accumulated from the paths' terminating nodes and trimmed. The smallest delay multiplier can then be selected and used to determine the delay budget for the current edge (360). The slack for each edge can be determined and the acceptance or need for redesign of the integrated circuit assessed.

Another Expression for X(e)

Another expression for X(e) can be derived. Note that each path p in P(e) can be decomposed into the following three parts:

(1) $p_B$: path from the starting node of path p to the head of edge e,
(2) e: edge e itself,
(3) $p_F$: path from the tail of edge e to the ending node of path p, where $p=(v_0, v_1, \ldots, v_i, v_{i+1}, \ldots, v_n)$ and $e=(v_i, v_{i+1})$, $p_B=(v_0, v_1, \ldots, v_i)$ and $p_F=(v_{i+1}, \ldots, v_n)$. In the following, $p_B$ is called a "backward path" to node $v_i$, and $p_F$ is called a "forward path" from node $v_{i+1}$. Using this decomposition of a path, S(p) defined by Equation 8 and T(p) defined by Equation 9 are also decomposed as follows:

$$S(p) = S_F(p_F) - D_{min}(e) - S_B(p_B), \qquad \text{Equation 13}$$

$$S_B(p_B) = A(V_0) + \sum_{e' \in E(p_B)} D_{min}(e'), \qquad \text{Equation 14}$$

$$S_F(p_F) = R(v_n) - \sum_{e' \in E(p_F)} D_{min}(e'), \qquad \text{Equation 15}$$

and $$T(p) = T_B(p_B) + (D(e) - D_{min}(e)) + T_F(p_F), \qquad \text{Equation 16}$$

$$T_B(p_B) = \sum_{e' \in E(p_B)} (D(e') - D_{min}(e')), \qquad \text{Equation 17}$$

$$T_F(p_F) = \sum_{e' \in E(p_F)} (D(e') - D_{min}(e')), \qquad \text{Equation 18}$$

where $S_B(p_B)$ is considered as the minimum arrival time at the ending node ($v_i$) of path $p_B$, $S_F(p_F)$ is considered as the maximum required arrival time at the starting node ($v_{i+1}$) of path $p_F$, $T_B(p_B)$ is considered as the "design slack" along path $p_B$, and $T_F(p_F)$ is considered as the "design slack" along path $p_F$.

Using Equation 13 and Equation 16, Equation 10 can be expressed as follows:

$$X(e) = \min_{p_B \in P_B(e)} \min_{p_F \in P_F(e)} \frac{S_F(p_F) - D_{min}(e) - S_B(p_B)}{T_B(p_B) + (D(e) - D_{min}(e)) + T_F(p_F)}, \quad \text{Equation 19}$$

where $P_B(e)$ is the set of the backward paths to the head of edge e, and $P_F(e)$ is the set of the forward paths from the tail of edge e. Equation 19, the calculation of X(e), is equivalent to finding the minimum value among backward and forward paths. Hence, a backward or forward path can be eliminated when it does not give the minimum value.

Conditions to Trim Paths

To find a condition that a backward path can be eliminated, let us compare two backward paths $p_B$ and $p_B$'. Due to the "min" operations in Equation 19, $p_B$' does not give the minimum value if the following inequality holds for every forward path $p_F$, and for a certain backward path $p_B$:

$$\frac{S_F(p_F) - D_{min}(e) - S_B(p_B)}{T_B(p_B) + (D(e) - D_{min}(e)) + T_F(p_F)} \leq \frac{S_F(p_F) - D_{min}(e) - S_B(p'_B)}{T_B(p'_B) + (D(e) - D_{min}(e)) + T_F(p_F)}. \quad \text{Equation 20}$$

Equation 20 can be simplified as follows:

$$\frac{a - S_B(p_B)}{T_B(p_B) + b} \leq \frac{a - S_B(p'_B)}{T_B(p'_B) + b}, \quad \text{Equation 21}$$

where $a = S_F(p_F) - D_{min}(e)$ and $b = (D(e) - D_{min}(e)) + T_F(p_F)$. Note that design slack b is always non-negative because a given implementation is at best the minimal delay implementation. It can also be assumes that a is non-negative.

This is explained as follows. If a is negative, the required arrival time at the tail of edge e is already negative according to Equation 15. Thus, any path which includes $p_F$ as a subpath always has negative slack even with the minimum delay $D_{min}$(e) for each of the timing edges on the path. In other words, when a is negative, this path cannot achieve the timing target even with the minimal delay implementation and (the circuit underlying) the path needs to be reengineered. Such a condition needs to be flagged. To avoid complicating the remaining discussion, the exceptional procedures necessary to report these paths is omitted and the description concentrates on the more basic method. Hence, a is assumed non-negative.

If Equation 21 holds for any non-negative numbers a and b, $p_B$' can be eliminated since it does not give the minimum value on the right hand side of Equation 19. The sufficient condition that Equation 21 holds for any non-negative numbers a and b is as follows:

$$S_B(p'_B) \leq S_B(p_B),\ T_B(p'_B) \leq T_B(p_B),\ S_B(p'_B) \times T_B(p_B) \leq S_B(p_B) \times T_B(p'_B). \quad \text{Equation 22}$$

Similarly, if the two paths $p_F$ and $p_F$' in $P_F(e)$ are compared, the condition that $p_F$' can be eliminated is as follows:

$$\frac{S_F(p_F) - D_{min}(e) - S_B(p_B)}{T_B(p_B) + (D(e) - D_{min}(e)) + T_F(p_F)} \leq \frac{S_F(p'_F) - D_{min}(e) - S_B(p_B)}{T_B(p_B) + (D(e) - D_{min}(e)) + T_F(p'_F)}. \quad \text{Equation 23}$$

Equation 23 can be simplified as follows:

$$\frac{S_F(p_F) - a}{b + T_F(p_F)} \leq \frac{S_F(p'_F) - a}{b + T_F(p'_F)}, \quad \text{Equation 24}$$

where $a = D_{min}(e) + S_B(p_B)$ and $b = T_B(p_B) + (D(e) - D_{min}(e))$. Note that a and b are non-negative. If Equation 24 holds for any non-negative numbers a and b, $p_F$' can be eliminated since it does not give the minimum value on the right hand side of Equation 19. The sufficient condition that Equation 24 holds for any non-negative numbers a and b is as follows:

$$S_F(p_F) \leq S_F(p'_F),\ T_F(p_F) \leq T_F(p'_F),\ S_F(p_F) \times T_F(p'_F) \leq S_F(p'_F) \times T_F(p_F). \quad \text{Equation 25}$$

Equation 22 and Equation 25 are the conditions used to implement the path trimming approach in this embodiment (and result in a reduction of the time complexity in the delay budget computation). For example, during backward path tracing, $P_B(e)$ is calculated for each timing edge. When $P_B(e)$ is being calculated, $P_F(e)$ is unknown, but this is not important because it is common to both $P_B(e)$ and $P_B$'(e) when they are compared. The information about forward paths, $S_F(p_F) - D_{min}(e)$ and $(D(e) - D_{min}(e)) + T_F(p_F)$ in Equation 19, is non-negative. Based on this information, $p_B$' in $P_B(e)$ can be eliminated if it satisfies Equation 22. The reason why such $p_B$' can be eliminated is that it does not give the minimum value in Equation 19 no matter what values the forward paths have, as long as they are non-negative. This path trimming approach reduces the number of elements in $P_B(e)$, and reduces the number of operations to be performed. Similarly, path trimming for $P_F(e)$ reduces the number of operations. Since all the $P_B(e)$ are compared independent of the $P_F(e)$ and vice versa, the number of computations is linearly proportional to the total number of backward and forward paths. This is much less than the total number of paths through timing edge e, which is a product of the number of backward paths and the number forward paths. Additional details of the path trimming approach are described below.

Algorithm to Calculate X(e) Using Path Trimming

The calculation of X(e) using path trimming is now explained as a software implementation. FIG. 4, FIG. 5, and FIG. 6 include pseudocode in accordance with one embodiment.

At line [400] of FIG. 4, procedure "Backward" is called for each timing node. The procedure Backward constructs a set $B_{set}(v)$, which is a set of pairs $(S_B(p_B), T_B(p_B))$ that contribute to X(e). The paths which do not contribute to X(e) have been eliminated from the set $B_{set}(v)$ after line [400]. The procedure Backward is shown in FIG. 5.

Similarly, the procedure "Forward" called at line [401] of FIG. 4 constructs a set $F_{set}(v)$, which is a set of pairs $(S_F(p_F), T_F(p_F))$ that contribute to X(e). The paths which do not contribute to X(e) have been eliminated from the set $F_{set}(v)$ after line [401]. The procedure Forward is shown in FIG. 6.

Line [404] is a branch to one of two cases, one is that D(e) is equal to $D_{min}(e)$ (from line [404] through line [407]), the other is that D(e) is greater than $D_{min}(e)$ (from line [408] through line [421]). When D(e) is equal to $D_{min}(e)$, the delay budget B(e) is always equal to $D_{min}(e)$ regardless of the value of X(e) according to Equation 4 and Equation 11. Hence, the calculation of X(e) can be omitted and simply set it to 1 (Line [406]). Lines [410] through line [420] represent the "min" calculation of Equation 19.

FIG. 5 shows a procedure Backward used to obtain the set $B_{set}(v)$, which is a set of pairs $(S_B(p_B), T_B(p_B))$ that can contribute to X(e) using Equation 19. The paths which do not contribute to X(e) are eliminated from the set $B_{set}(v)$ with a path trimming process (lines [513] through [527]) as will be explained in detail.

Each node need only be processed once. Line [500] in FIG. 5 prevents a node from being processed more than once.

Line [501] initializes the set $B_{set}(v)$. When node v is the starting node of a path, the backward path $p_B$ to node v is v itself and does not have any edges. In this case, $S_B(p_B)$ is equal to the arrival time at node v according to Equation 14, and $T_B(p_B)$ is 0 according to Equation 17. When node v is not the starting node of a path, there exist incoming edges to node v and lines [502] through line [512] are executed to calculate $B_{set}(v)$. In this case, $B_{set}(v)$ is constructed based on $B_{set}(u)$ of the head u of each incoming edge.

At line [505], $B_{set}(u)$ of the head of the incoming edge e is constructed. Procedure Backward is recursively called for this purpose.

Lines [506] through [511] calculate $S_B(p_B)$ and $T_B(p_B)$ based on $B_{set}(u)$ of u (the head of each incoming edge). Since the information from the backward paths to node u is already stored in $B_{set}(u)$, the delay information between node u and node v, that is edge e, is added (line [508] and [509]). The calculation is based on Equation 14 and Equation 17.

Lines [513] through [527] are very important. These steps trim the paths which do not contribute to X(e). The conditions to trim the paths are given by Equation 22. Due to these path trimming steps, the number of the elements in set $B_{set}(v)$ can be reduced. As a result, the number of the iterations of the loop from line [506] through line [512] can be reduced. Moreover, the work required of the loop from line [413] through line [420] can be reduced. This means the run time can be reduced compared to the case where all the paths are included in the set $B_{set}(v)$.

The explanation of procedure "Forward" shown in FIG. 6 is omitted since it is similar to that of procedure Backward.

Figure 7:
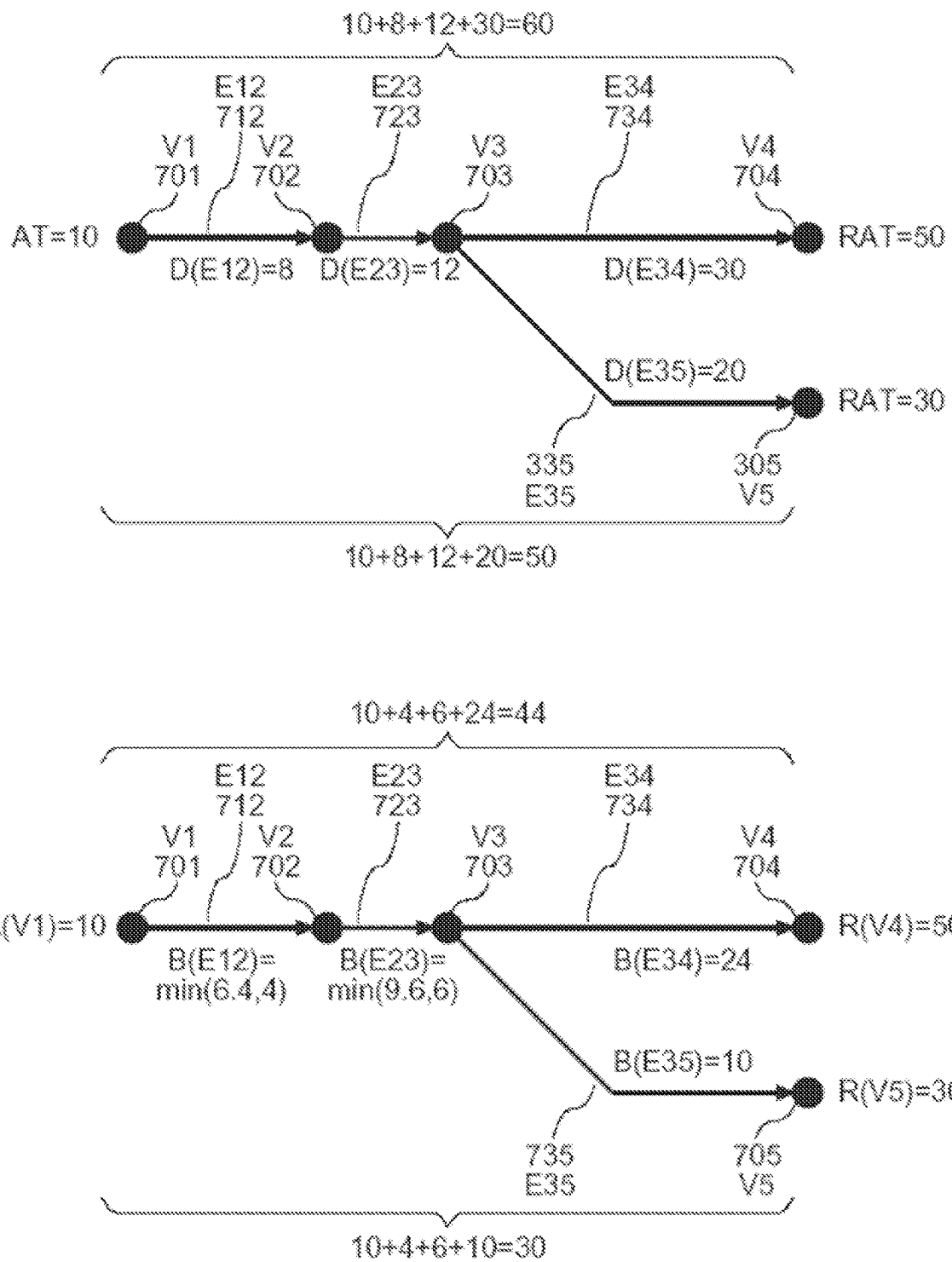
FIG. 7 is a diagram illustrating a graph representation of a simple system in accordance with one embodiment.

Two examples will now be discussed. FIG. 7 illustrates the graph representation of the circuit shown in FIG. 1a. Circles represent timing nodes and have labels prefixed with "V" (for vertex). Arrows represent timing edges and have labels prefixed with "E". Timing node V1 (701) corresponds to pin 101 of FIG. 1, timing node V2 (702) corresponds to pin 102, and so on. Edge E12 (712) from node V1 to node V2, corresponds to interconnect 112 of FIG. 1, edge E23 (723) from node V2 to node V3, corresponds to component 123, and so on. The timing delays "D(e)" and timing budgets "B(e)" are specified for the edges and paths. The timing slacks are specified for the paths as well. For example, path=(V1,V2,V3,V4) has an initial delay of 60 and slack of −10 in FIG. 7a, becoming budget=44 and slack=+6 in FIG. 7b.

EXAMPLE 1

FIG. 7 includes the delays "D(e)" and delay budgets "B(e)" of an example in accordance with one embodiment. In this example, $D_{min}(e)=0$ is assumed for each timing edge e.

First, process Backward is executed for each timing node (Line [400]). When v=V1, there are no incoming edges.

Hence, $B_{set}(V1)=\{(10,0)\}$. When v=V2, the initial value of $B_{set}(V2)$ is Ø since there exists an incoming edge e=(V1,V2)=E12. Let u denote the head of this edge, which is node V1 (Line [504]). Execute Backward(V1) (Line [505]). Since node V1 is already visited, it simply comes back without doing anything (Line [500]). Set $(S_B, T_B)=(10,0)$, which is the only element in $B_{set}(V1)$ (Line [506]). Since $D_{min}(e)=0$, $S_B$ is not updated, and remains 10 (Line [508]). Since D(E12)=8, $T_B$ becomes 0+(8−0)=8 (Line 509). $B_{set}(V2)$ is now $\{(10,8)\}$ (Line [510]). Since there is only one element in $B_{set}(V2)$, nothing is done from line [513] through [527]. Similarly, Backward procedure gives $B_{set}(V3)=\{(10,20)\}$, $B_{set}(V4)=\{(10,50)\}$, and $B_{set}(V5)=\{(10,40)\}$.

Second, the process Forward is executed for each timing node (Line [401]). The results are $F_{set}(V1)=\{(30,40)\}$, $F_{set}(V2)=\{(30,32)\}$, $F_{set}(V3)=\{(30,20)\}$, $F_{set}(V4)=\{(50,0)\}$, and $F_{set}(V5)=\{(30,0)\}$. The trimming process (Line [613] through [627]) is executed when $F_{set}(V3)$ is obtained. Just before line [613], $F_{set}(V3)$ was $\{(30,20), (50,30)\}$. Since 30≦50, 20≦30, and 30−30≦50−20, (50,30) is eliminated from $F_{set}(V3)$ at line [624].

Third, X(e) is calculated for each timing edge (from line [402] through line [422]). When e=(V1,V2)=E12, X(E12) is equal to (30−0−10)/(0+8−0+32)=0.5 (Line [417] and [418]). Similarly, X(E23)=0.5, X(E34)=0.8, and X(E35)=0.5.

EXAMPLE 2

Figure 8A:
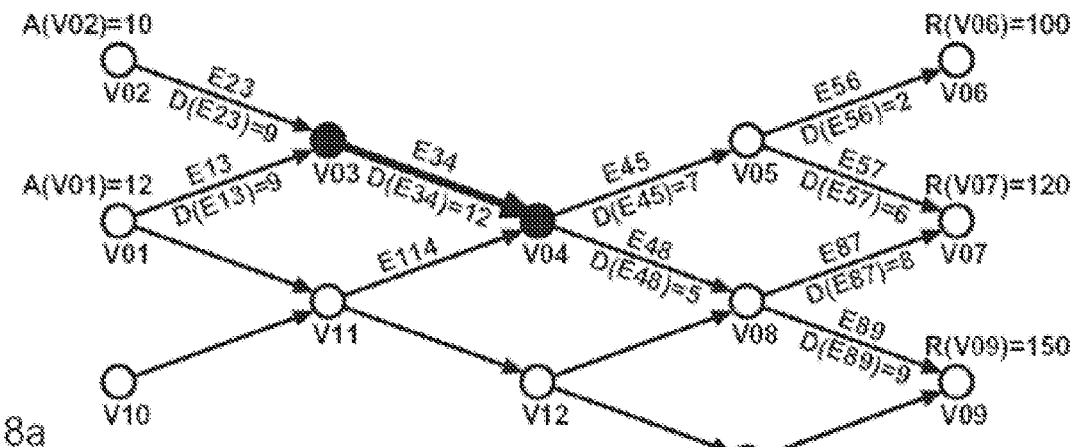
FIG. 8 is a diagram illustrating a graph representation of a system in accordance with one embodiment.
Figure 8B:
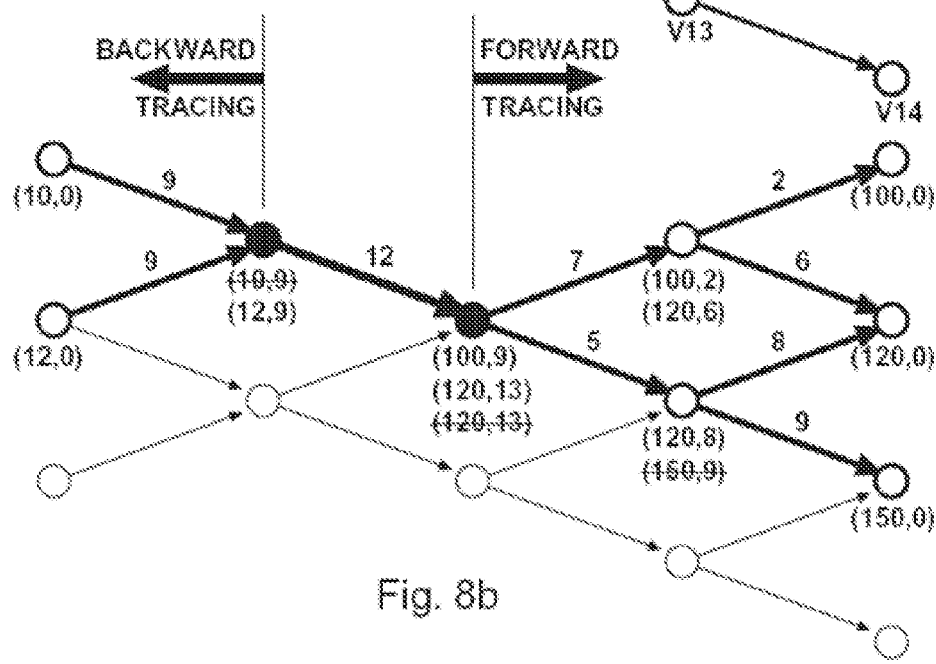
Figure 8C:
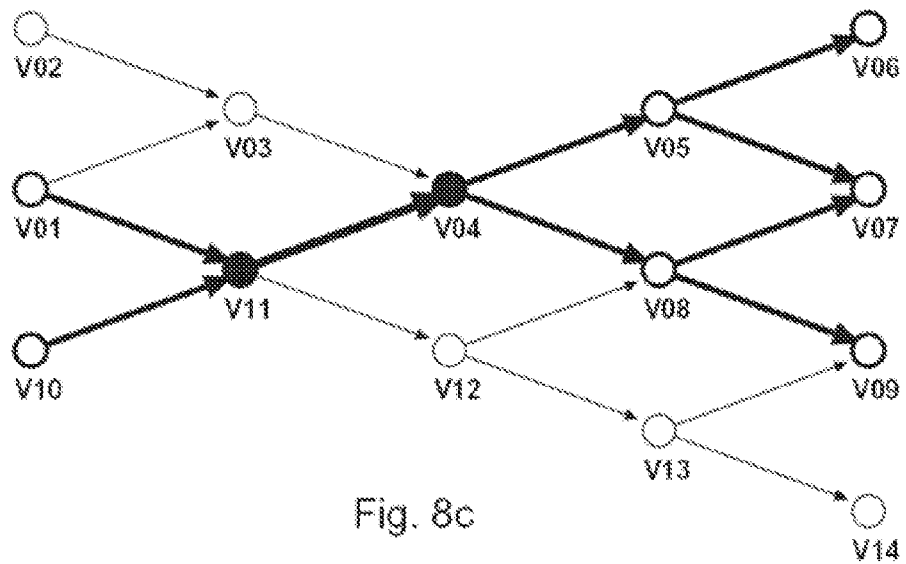

FIG. 8 illustrates an example in accordance with one embodiment. In this more complex example, it is also assume $D_{min}(e)=0$ for each timing edge e. The pairs of numbers surrounded by parentheses represent the results of backward or forward tracing, as appropriate. Among them, those attached to timing nodes V02, V01, and V03 represent the contents of $B_{set}(v)$ after applying Backward(V03), and those attached to timing nodes V04, V05, V06, V07, V08, and V09 represent the contents of $F_{set}(u)$ after applying Forward (V04). A pair of numbers struck through, such as at node V08, represents a trimmed backward or forward path after applying path trimming (lines [513] through [527] in FIG. 5 and lines [613] through [627] in FIG. 6). Note that there are only 2 pairs at V04. Without path trimming, there would normally be 4 pairs. There are only 2 pairs due to the path trimming at V08 and V04. Since node V04 uses the results of node V08, the path trimming has a multiplying effect. When the size of the set at each node is reduced by path trimming, the number of the iterations of the loop (lines [413] through [420] in FIG. 4) is also reduced. This illustrates the significant reduction in computation possible when using path trimming.

The overhead associated with the trimming calculations is further amortized when additional edges are examined (if this information is stored). For example, when considering edge e=(V11,V04) the forward tracing from tail node V04 has already been performed.

Analysis of Run Time

The following is an example analysis of the run time in accordance with one embodiment. In the worst case, the time complexity of this invention is $O(N^2)$ for each timing edge, where N is the number of the paths going through a timing edge. On the other hand, the time complexity of the algorithm without path trimming is O(N) for each timing edge, and that of [YS90] is O(1). The worst time complexity comes from the path trimming steps (lines [513] through [527] in FIG. 5 and lines [613] through [627] in FIG. 6). In the worst case, no paths are trimmed and the number of the elements in $B_{set}(v)$ or $F_{set}(u)$ can be equal to the number of the paths, that is N. And lines [513] through [527] in FIG. 5 and lines [613]

through [627] in FIG. 6 are loops going through all the pairs in set $B_{set}(v)$ or $F_{set}(u)$. The number of the pairs in set $B_{set}(v)$ or $F_{set}(u)$ is equal to the number of the combinations of two elements out of N elements, that is $N(N-1)/2$. Hence the time complexity of these loops is $O(N^2)$, which is slower than the algorithm without path trimming steps.

However, in practice, when implemented and applied to real designs, the method employing path trimming was much faster than the algorithm without path trimming. The reason is explained in the following.

First, consider the worst case. In the worst case, none of the paths are eliminated by path trimming steps. This happens when none of the elements in $B_{set}(v)$ and $F_{set}(u)$ is eliminated by path trimming steps. Assume $F_{set}(u)$ has N elements, which is equal to the number of the paths in the worst case. The probability that none of the elements in $F_{set}(u)$ is eliminated by path trimming steps is $(1-p)^{N(N-1)/2}$, where p is the probability that one of the given two elements is trimmed by examining Equation 25. Hence 1−p is the probability that the given two elements remain untrimmed. Then $(1-p)^{N(N-1)/2}$ is the probability that none of the elements in $F_{set}(u)$ is trimmed. This is because the number of the pairs in $F_{set}(u)$ is $N(N-1)/2$, and the probability that each pair remains untrimmed is 1−p. The value of p is 0.25. This is calculated as follows: The condition that Equation 25 holds for a given pair $(S_F(p_F),T_F(p_F))$ and $(S_F(p_F'),T_F(p_F'))$ is 0.125 if $(S_F(p_F),T_F(p_F))$ and $(S_F(p_F'),T_F(p_F'))$ are randomly generated. This is because Equation 25 consists of 3 inequalities, the probability that each of them holds is ½ and ½×½×½=⅛=0.125. Equation 25 represents the case where $(S_F(p_F),T_F(p_F))$ is eliminated by $(S_F(p_F),T_F(p_F))$. It is also possible that $(S_F(p_F),T_F(p_F))$ is eliminated by $(S_F(p_F'),T_F(p_F'))$, and its probability is 0.125 as well. So, the total probability that either $(S_F(p_F),T_F(p_F))$ or $(S_F(p_F'),T_F(p_F'))$ is eliminated is p=0.125+0.125=0.25. When the timing node u is on the path sending the select signal to 32-bit multiplexer, the number of the paths going through node u is at least 32. In this case, the probability of the worst case that none of the pairs in $F_{set}(u)$ is eliminated is at most $(1-p)^{N(N-1)/2} = (1-0.25)^{32(32-1)/2} = 1.07 \times 10^{-62}$. The larger N becomes, the smaller the probability of the worst case becomes. If N is sufficiently large, the probability of the worst case is negligible. Although the worst case does not occur, there may still remain a large number of paths even after path trimming. The probability distribution of the number of the remaining paths is now discussed.

Figure 9:
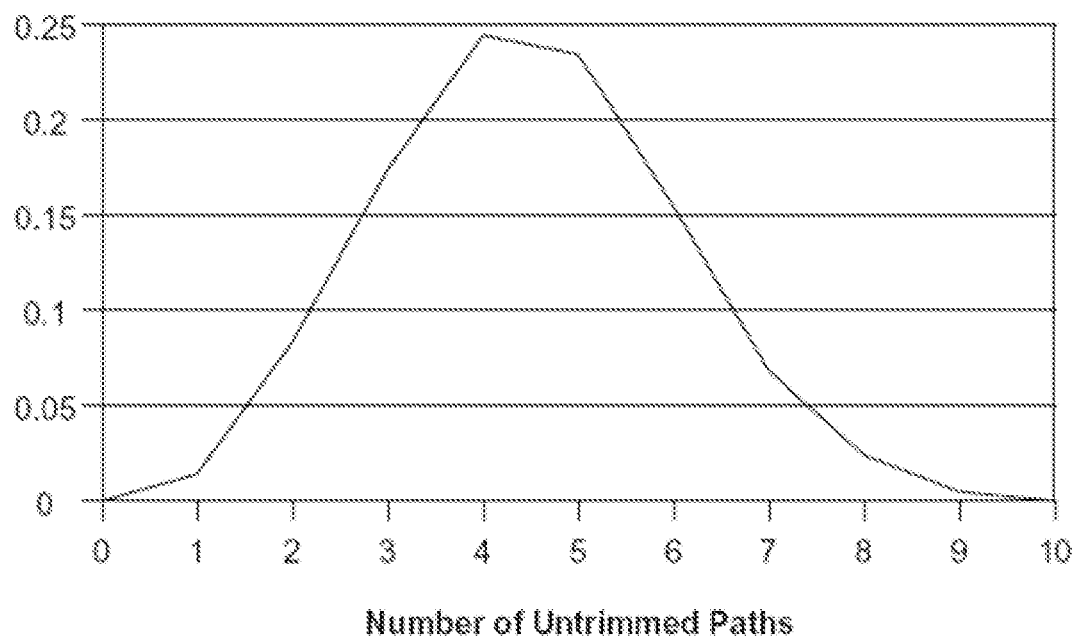
FIG. 9 is a plot of probability distributions of a number of the remaining paths in one example.
Figure 10:
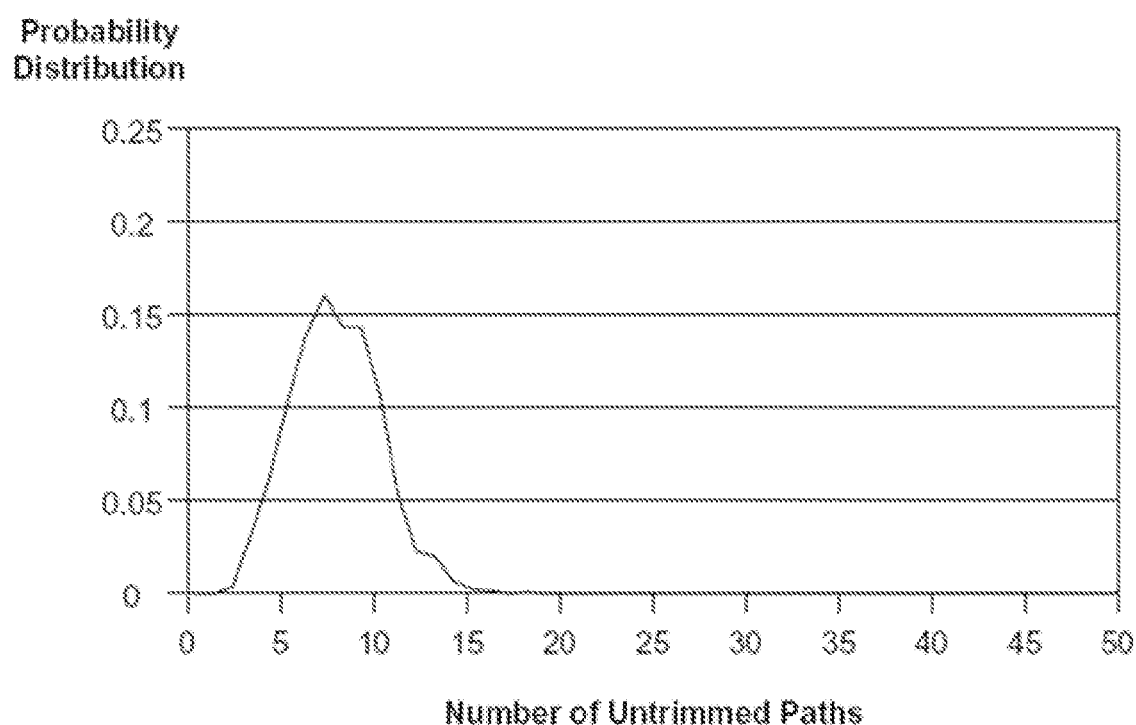
FIG. 10 is a plot of probability distributions of a number of the remaining paths in one example.
Figure 11:
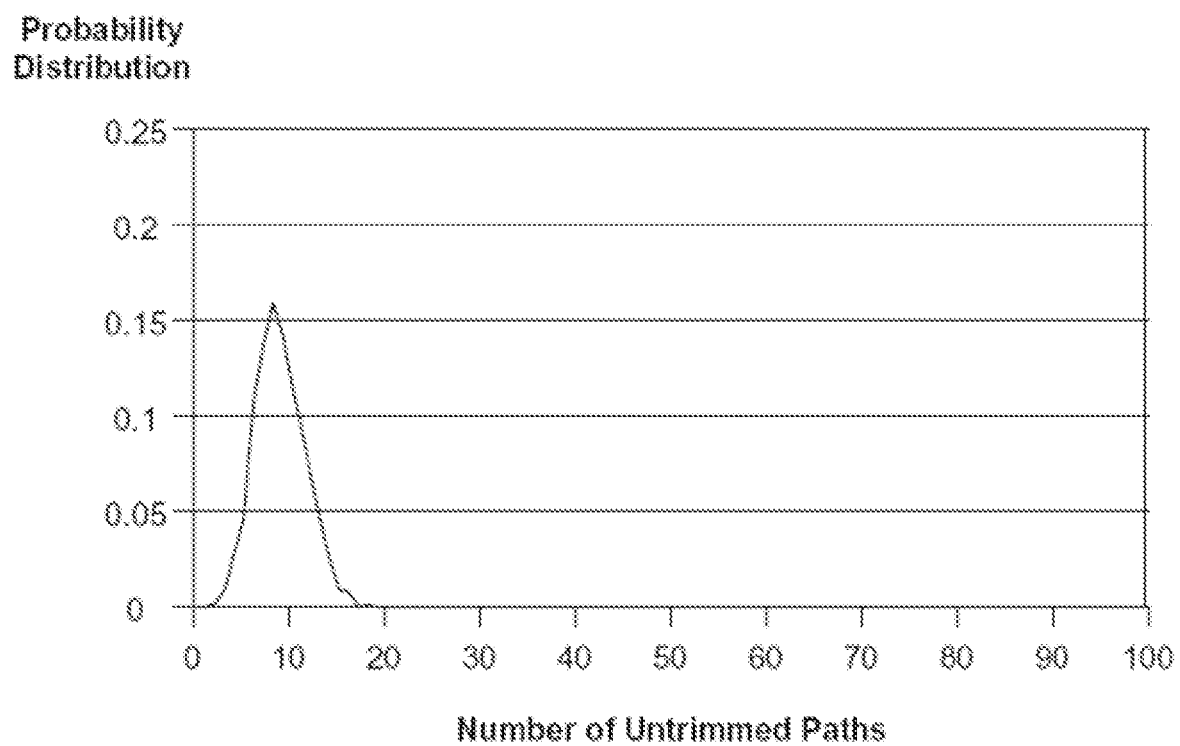
FIG. 11 is a plot of probability distributions of a number of the remaining paths in one example.

Consider a numerical simulation. The probability distributions of the number of the remaining paths are shown in FIG. 9, FIG. 10, and FIG. 11 for N=10, 50, and 100, respectively, where N is the number of the paths before path trimming. N pairs $(S_F(p_F),T_F(p_F))$ are randomly generated to form $F_{set}(u)$, path trimming is performed, and the remaining (untrimmed) paths are counted. These steps are repeated 1000 times for each of N=10, 50, and 100 to get the probability distributions of the number of the remaining paths. FIG. 9 shows the results for N=10. According to FIG. 9, 4 or 5 paths out of 10 most likely remain after path trimming. FIG. 10 shows the results for N=50. The number of the remaining paths averages about 8 and does not exceed 20. FIG. 11 shows the results for N=100. The number of the remaining paths averages about 9 and also does not exceed 20. From these experiments, it can be concluded that not very many paths will remain after path trimming, and the number of the remaining paths does not increase very much as N increases. If so, what is the relationship between N and the number of the remaining paths?

Figure 12:
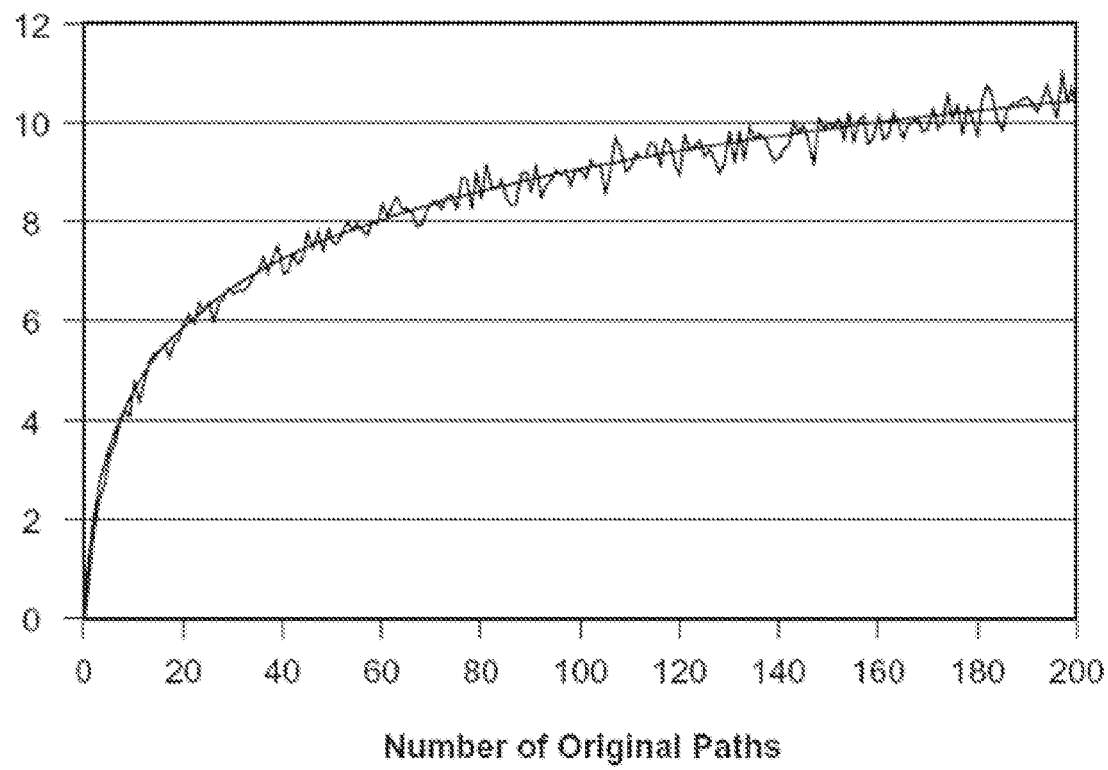
FIG. 12 is a plot of probability distributions of a number of the remaining paths in one example.

FIG. 12 shows the relationship between the number of the original paths (N) and the average number of the remaining paths after path trimming steps. For each of N ranging from 1 to 200, N pairs of $(S_F(p_F),T_F(p_F))$ are randomly generated to form $F_{set}(u)$, applied path trimming steps, and counted the remaining (untrimmed) paths. These steps were repeated 100 times for each of N ranging from 1 to 200 to get the average number of the remaining paths for each N. According to FIG. 12, a logarithmic function fits well, and the average number of the remaining paths does not exceed 11 even when N reaches 200.

According to the above experiments, especially FIG. 12, it can be concluded that the average time complexity of the method using path trimming is $O((\log N)^2)$ for each timing edge, where N is the number of the paths going through the timing edge. This is because the number of the elements in $B_{set}(v)$ or $F_{set}(u)$ is already trimmed down to the order of $O(\log N)$ because of the path trimming steps previously executed at the other preceding timing nodes. Hence, the number of iteration of the loops (lines [513] through [527] in FIG. 5, lines [613] through [627] in FIG. 6, and lines [413] through [420] in FIG. 4) is of the order of $O((\log N)^2)$. This time complexity is much less than that of the algorithm to calculate X(e) without path trimming, whose time complexity is O(N).

Intuitively speaking, although there can be many paths through a timing edge, a critical path determines the timing budget for that edge. The trimming process sorts out these critical paths and reduces the amount of computation needed to do so.

This method calculates delay scaling factors to calculate delay budgets in a more efficient manner (using a path trimming approach). The previous work could not calculate delay scaling factors without sacrificing the run time. To reduce the run time, this method efficiently sorts out timing critical paths by eliminating timing non-critical paths based on Equation 22 and Equation 25, or lines [513] through [527] in FIG. 5 and lines [613] through [627] in FIG. 6.

With path trimming, the run time of calculating the delay scaling factors is considerably shorter than those of the prior works, making it feasible to do so for real design applications.

It should be noted that, while the foregoing discussion focuses on method embodiments of the invention, an alternative embodiment comprises a software program product. This product consists of a computer-readable storage medium that contains program instructions configured to cause a computer to perform a method as described above. The computer-readable storage medium may include any of a number of storage media, such as RAM, ROM, flash memory, EPROM memory, EEPROM memory, registers, hard disks, removable disks, CD-ROMs, optical media and so on. The instructions contained in the storage medium may be executable by any type of data processor, and are not limited to instructions executable by personal or general purpose computers.

While the foregoing description presents several specific exemplary embodiments, there may be many variations of the described features and components in alternative embodiments. For example, in another embodiment, the intermediate values generated as a result of the subpath evaluations are stored and made readily available during the evaluations of other nets. The values may, for example, be stored in an appropriately constructed tree structure. In another embodiment, an IC is partitioned into "timing independent" blocks to reduce the size/scope of the design problem, for example. In another embodiment, nets are grouped together and each group is examined by a different process (a.k.a., multitasking, parallel processing). Many other variations will also be apparent to persons of skill in the art of the invention upon reading the present disclosure.

It should be noted that the methods described above are designed to provide an exact solution to the problem of determining the smallest scaling factor of all the timing paths that include a particular edge in the circuit (and repeating this for each edge.) Alternative embodiments, however, may implement trimming criteria and/or method steps that are designed to provide an approximate, rather than exact, solution to this problem.

Those of skill in the art will understand that information and signals may be represented using any of a variety of different technologies and techniques. For example, data, instructions, commands, information, signals, bits, and symbols that may be referenced throughout the above description may be represented by voltages, currents, electromagnetic waves, magnetic fields or particles, optical fields or particles, or any combination thereof. The information and signals may be communicated between components of the disclosed systems using any suitable transport media, including wires, metallic traces, vias, optical fibers, and the like.

Those of skill will further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Those of skill in the art may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with application specific integrated circuits (ASICs,) field programmable gate arrays (FPGAs) or other logic devices, discrete gates or transistor logic, discrete hardware components, or any combination thereof designed to perform the functions described herein.

The steps of a method or algorithm described in connection with the embodiments disclosed herein may be embodied directly in hardware, in software (program instructions) executed by a processor, or in a combination of the two. Software may reside in RAM memory, flash memory, ROM memory, EPROM memory, EEPROM memory, registers, hard disk, a removable disk, a CD-ROM, or any other form of storage medium known in the art. Such a storage medium containing program instructions that embody one of the present methods is itself an alternative embodiment of the invention. One exemplary storage medium may be coupled to a processor, such that the processor can read information from, and write information to, the storage medium. In the alternative, the storage medium may be integral to the processor. The processor and the storage medium may reside, for example, in an IC.

The benefits and advantages which may be provided by the present invention have been described above with regard to specific embodiments. These benefits and advantages, and any elements or limitations that may cause them to occur or to become more pronounced are not to be construed as critical, required, or essential features of any or all of the claims. As used herein, the terms "comprises," "comprising," or any other variations thereof, are intended to be interpreted as non-exclusively including the elements or limitations which follow those terms. Accordingly, a system, method, or other embodiment that comprises a set of elements is not limited to only those elements, and may include other elements not expressly listed or inherent to the claimed embodiment.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein and recited within the following claims.

What is claimed is:

1. A computer-implemented method for determining delay budget allocations for edges in an integrated circuit, the method performed by a computer and comprising:
    defining timing edges and corresponding timing paths in an integrated circuit design; and for one or more of the edges,
        determining a set of minimum/maximum arrival time and design slack (S,T) pairs characterizing timing paths beginning or ending at the edge,
        trimming one or more of the timing paths based on the associated (S,T) pairs,
        determining a scaling factor associated with the edge based on the (S,T) pairs associated with untrimmed timing paths,
        multiplying the scaling factor associated with the edge by an initial delay associated with the edge to produce a delay budget allocation associated with the edge,
    for each of a plurality of nodes adjacent to the edges of the integrated circuit, the computer determining a set of (S,T) pairs associated with the node, wherein determining the set of (S,T) pairs associated with each node in a backward timing path comprises:
        for a first node in the backward timing path, setting S equal to an arrival time defined for the first node, and setting T equal to 0; and
        for one or more following nodes in the backward timing path, setting S equal to the S of a preceding node plus a minimum delay of an intervening edge, and setting T equal to the T of the preceding node plus a current delay of the intervening edge minus the minimum delay of the intervening edge.

2. The method of claim 1, wherein determining the set of (S,T) pairs comprises:
    determining a set of (S,T) pairs characterizing backward timing paths ending at the edge;
    trimming one or more of the backward timing paths based on the associated (S,T) pairs;
    determining a set of a set of (S,T) pairs characterizing forward timing paths beginning at the edge; and
    trimming one or more of the forward timing paths based on the associated (S,T) pairs.

3. The method of claim 1, wherein determining a scaling factor associated with the edge comprises:
    for each combination of one of the (S,T) pairs associated with the backward timing paths and one of the (S,T) pairs associated with the forward timing paths, determining a corresponding scaling factor; and
    selecting a smallest one of the scaling factors corresponding to the combinations of (S,T) pairs as the scaling factor associated with the edge.

4. The method of claim 1, wherein trimming a selected one of the timing paths comprises determining whether the selected timing path meets one or more trimming criteria and trimming the selected timing path if the trimming criteria are met.

5. The method of claim 4, wherein the selected timing path comprises a backward timing path, and the trimming criteria for the selected backward timing path comprise:
the minimum arrival time (S) associated with the selected backward timing path is less than or equal to the minimum arrival time (S') associated with a second backward timing path;
the design slack (T) associated with the selected backward timing path is less than or equal to the design slack (T') associated with the second backward timing path; and
a product of the minimum arrival time associated with the selected backward timing path and the design slack value associated with the second backward timing path (S×T') is less than or equal to a product of the minimum arrival time associated with the second backward timing path and the design slack value associated with the selected backward timing path (S'×T).

6. The method of claim 4, wherein the selected timing path comprises a forward timing path, and the trimming criteria for the selected forward timing path comprise:
the maximum arrival time (S) associated with the selected forward timing path is greater than or equal to the maximum arrival time (S') associated with a second forward timing path;
the design slack (T) associated with the selected forward timing path is greater than or equal to the design slack (T') associated with the second forward timing path; and
a product of the maximum arrival time associated with the selected forward timing path and the design slack value associated with the second forward timing path (S×T') is greater than or equal to a product of the maximum arrival time associated with the second forward timing path and the design slack value associated with the selected forward timing path (S'×T).

7. The method of claim 1, wherein determining the set of (S,T) pairs associated with each node in a forward timing path comprises:
for a last node in the forward timing path, setting S equal to an arrival time defined for the last node, and setting T equal to 0; and
for one or more preceding nodes in the forward timing path, setting S equal to the S of a following node minus a minimum delay of an intervening edge, and setting T equal to the T of the following node plus a current delay of the intervening edge minus the minimum delay of the intervening edge.

8. A software program product comprising:
a computer-readable medium containing one or more program instructions, wherein the instructions are configured to cause a computer to perform the method including the steps of
reading data defining timing edges and corresponding timing paths in an integrated circuit design; and
for one or more of the edges,
determining a set of minimum/maximum arrival time and design slack (S,T) pairs characterizing timing paths beginning or ending at the edge,
trimming one or more of the timing paths based on the associated (S,T) pairs,
determining a scaling factor associated with the edge based on the (S,T) pairs associated with untrimmed timing paths,
multiplying the scaling factor associated with the edge by an initial delay associated with the edge to produce a delay budget allocation associated with the edge, and
storing the delay budget allocation,
wherein determining the set of (S,T) pairs associated with each node in a backward timing path comprises:
for a first node in the backward timing path, setting S equal to an arrival time defined for the first node, and setting T equal to 0; and
for one or more following nodes in the backward timing path, setting S equal to the S of a preceding node plus a minimum delay of an intervening edge, and setting T equal to the T of the preceding node plus a current delay of the intervening edge minus the minimum delay of the intervening edge.

9. The software program product of claim 8, wherein determining the set of (S,T) pairs comprises:
determining a set of (S,T) pairs characterizing backward timing paths ending at the edge;
trimming one or more of the backward timing paths based on the associated (S,T) pairs;
determining a set of a set of (S,T) pairs characterizing forward timing paths beginning at the edge; and
trimming one or more of the forward timing paths based on the associated (S,T) pairs.

10. The software program product of claim 8, wherein determining a scaling factor associated with the edge comprises:
for each combination of one of the (S,T) pairs associated with the backward timing paths and one of the (S,T) pairs associated with the forward timing paths, determining a corresponding scaling factor; and
selecting a smallest one of the scaling factors corresponding to the combinations of (S,T) pairs as the scaling factor associated with the edge.

11. The software program product of claim 8, wherein trimming a selected one of the timing paths comprises determining whether the selected timing path meets one or more trimming criteria and trimming the selected timing path if the trimming criteria are met.

12. The software program product of claim 11, wherein the selected timing path comprises a backward timing path, and the trimming criteria for the selected backward timing path comprise:
the minimum arrival time (S) associated with the selected backward timing path is less than or equal to the minimum arrival time (S') associated with a second backward timing path;
the design slack (T) associated with the selected backward timing path is less than or equal to the design slack (T') associated with the second backward timing path; and
a product of the minimum arrival time associated with the selected backward timing path and the design slack value associated with the second backward timing path (S×T') is less than or equal to a product of the minimum arrival time associated with the second backward timing path and the design slack value associated with the selected backward timing path (S'×T).

13. The software program product of claim 11, wherein the selected timing path comprises a forward timing path, and the trimming criteria for the selected forward timing path comprise:
the maximum arrival time (S) associated with the selected forward timing path is greater than or equal to the maximum arrival time (S') associated with a second forward timing path;

the design slack (T) associated with the selected forward timing path is greater than or equal to the design slack (T') associated with the second forward timing path; and a product of the maximum arrival time associated with the selected forward timing path and the design slack value associated with the second forward timing path (S×T') is greater than or equal to a product of the maximum arrival time associated with the second forward timing path and the design slack value associated with the selected forward timing path (S'×T).

14. The software program product of claim 8, wherein the method further comprises, for each of a plurality of nodes adjacent to the edges of the integrated circuit, determining a set of (S,T) pairs associated with the node.

15. A software program product comprising:

a computer-readable medium containing one or more program instructions, wherein the instructions are configured to cause a computer to perform the method including the steps of reading data defining timing edges and corresponding timing paths in an integrated circuit design; and for one or more of the edges, determining a set of minimum/maximum arrival time and design slack (S,T) pairs characterizing timing paths beginning or ending at the edge, trimming one or more of the timing paths based on the associated (S,T) pairs, determining a scaling factor associated with the edge based on the (S,T) pairs associated with untrimmed timing paths, multiplying the scaling factor associated with the edge by an initial delay associated with the edge to produce a delay budget allocation associated with the edge, and storing the delay budget allocation, wherein determining the set of (S,T) pairs associated with each node in a forward timing path comprises:

for a last node in the forward timing path, setting S equal to an arrival time defined for the last node, and setting T equal to 0; and for one or more preceding nodes in the forward timing path, setting S equal to the S of a following node minus a minimum delay of an intervening edge, and setting T equal to the T of the following node plus a current delay of the intervening edge minus the minimum delay of the intervening edge.

16. The software program product of claim 8, further comprising presenting the delay budget allocation associated with each edge to a user.

* * * * *